(12) United States Patent
Bauer et al.

(10) Patent No.: US 7,834,467 B2
(45) Date of Patent: Nov. 16, 2010

(54) LAYER BETWEEN INTERFACES OF DIFFERENT COMPONENTS IN SEMICONDUCTOR DEVICES

(75) Inventors: Michael Bauer, Nittendorf (DE); Alfred Haimerl, Sinzing (DE); Khalil Hosseini, Weihmichl (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 132 days.

(21) Appl. No.: 11/692,322

(22) Filed: Mar. 28, 2007

(65) Prior Publication Data

US 2007/0205518 A1    Sep. 6, 2007

Related U.S. Application Data

(63) Continuation of application No. PCT/DE2005/001722, filed on Sep. 28, 2005.

(30) Foreign Application Priority Data

Sep. 30, 2004   (DE) .................. 10 2004 048 201

(51) Int. Cl.
*H01L 23/28* (2006.01)
*H01L 23/495* (2006.01)

(52) U.S. Cl. ............... 257/787; 257/666; 257/E23.077; 977/742; 977/785; 977/831

(58) Field of Classification Search ............ 257/787, 257/666; 977/742, 785, 831
See application file for complete search history.

(56) References Cited

U.S. PATENT DOCUMENTS

| 5,122,858 | A | | 6/1992 | Mahulikar et al. |
| 5,777,433 | A | * | 7/1998 | Lester et al. ............. 313/512 |
| 5,817,544 | A | | 10/1998 | Parthasarathi |
| 6,407,922 | B1 | * | 6/2002 | Eckblad et al. ............ 361/704 |
| 6,741,019 | B1 | * | 5/2004 | Filas et al. ................ 313/355 |
| 6,831,017 | B1 | * | 12/2004 | Li et al. ..................... 438/694 |
| 6,890,654 | B2 | * | 5/2005 | Stupp et al. ................ 428/403 |
| 7,019,391 | B2 | * | 3/2006 | Tran .......................... 257/678 |
| 7,109,591 | B2 | * | 9/2006 | Hack et al. ................. 257/788 |
| 7,112,472 | B2 | * | 9/2006 | Dubin ........................ 438/122 |
| 7,365,100 | B2 | * | 4/2008 | Kuper et al. ................ 516/32 |
| 2003/0208888 | A1 | | 11/2003 | Fearing et al. |

(Continued)

FOREIGN PATENT DOCUMENTS

DE    10124047 B4    12/2006

(Continued)

OTHER PUBLICATIONS

D. Qian et al.; "Load Transfer and Deformation Mechanisms in Carbon Nanotube-Polystyrene Composites", Applied Physics Letters, vol. 76, No. 20, May 15, 2000, pp. 2868-2870.

*Primary Examiner*—Nitin Parekh
(74) *Attorney, Agent, or Firm*—Edell, Shapiro & Finnan, LLC

(57) ABSTRACT

A layer improves adhesion between interfaces of different components in semiconductor devices. The interface of a first component includes surfaces of a circuit carrier and the interface of a second component includes contact surfaces of a plastic package molding compound. The adhesion-improving layer includes a mixture of polymeric chain molecules and carbon nanotubes.

17 Claims, 7 Drawing Sheets

U.S. PATENT DOCUMENTS

| | | |
|---|---|---|
| 2004/0053053 A1 | 3/2004 | Jiang et al. |
| 2004/0097635 A1* | 5/2004 | Fan et al. .................... 524/496 |
| 2004/0206448 A1 | 10/2004 | Dubrow |
| 2005/0238889 A1* | 10/2005 | Iwamoto et al. ............. 428/446 |
| 2008/0020250 A1 | 1/2008 | Schuetz et al. |

FOREIGN PATENT DOCUMENTS

| | | |
|---|---|---|
| WO | 9940812 | 8/1999 |
| WO | 0121863 A1 | 3/2001 |
| WO | 0243937 A2 | 6/2002 |
| WO | 03060941 A1 | 7/2003 |
| WO | 03095190 A1 | 11/2003 |
| WO | 04001107 A2 | 12/2003 |
| WO | 2004012937 A1 | 2/2004 |
| WO | 2004070349 A2 | 8/2004 |

* cited by examiner

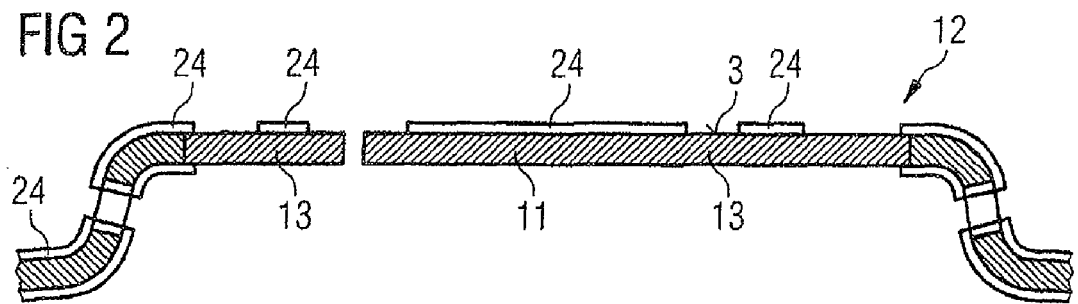
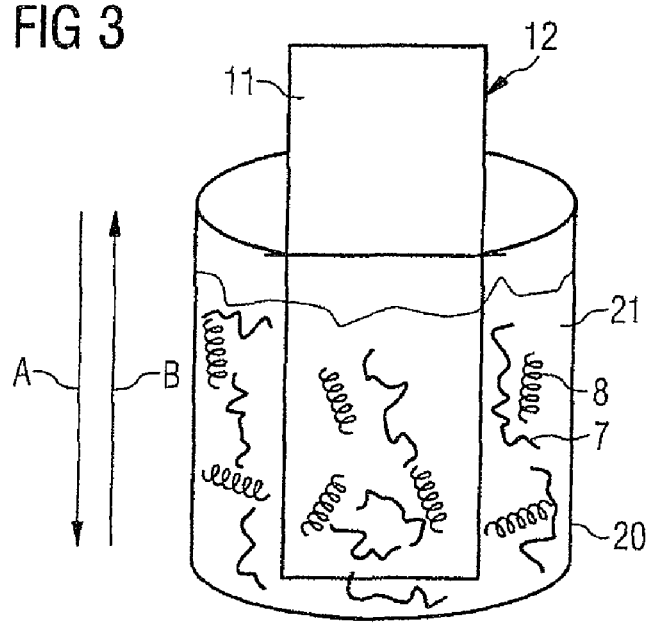
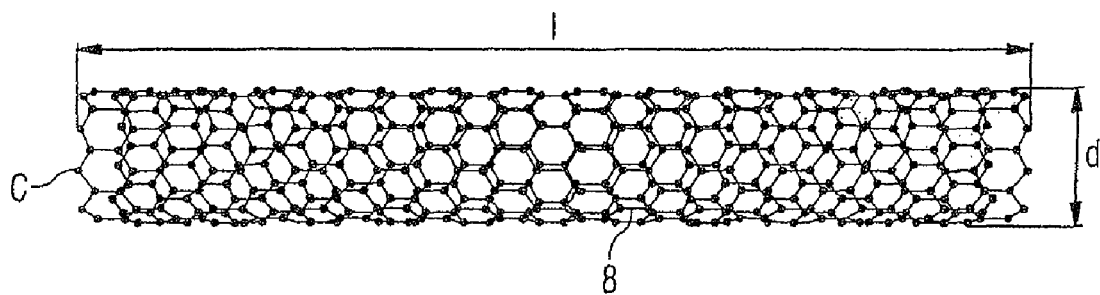

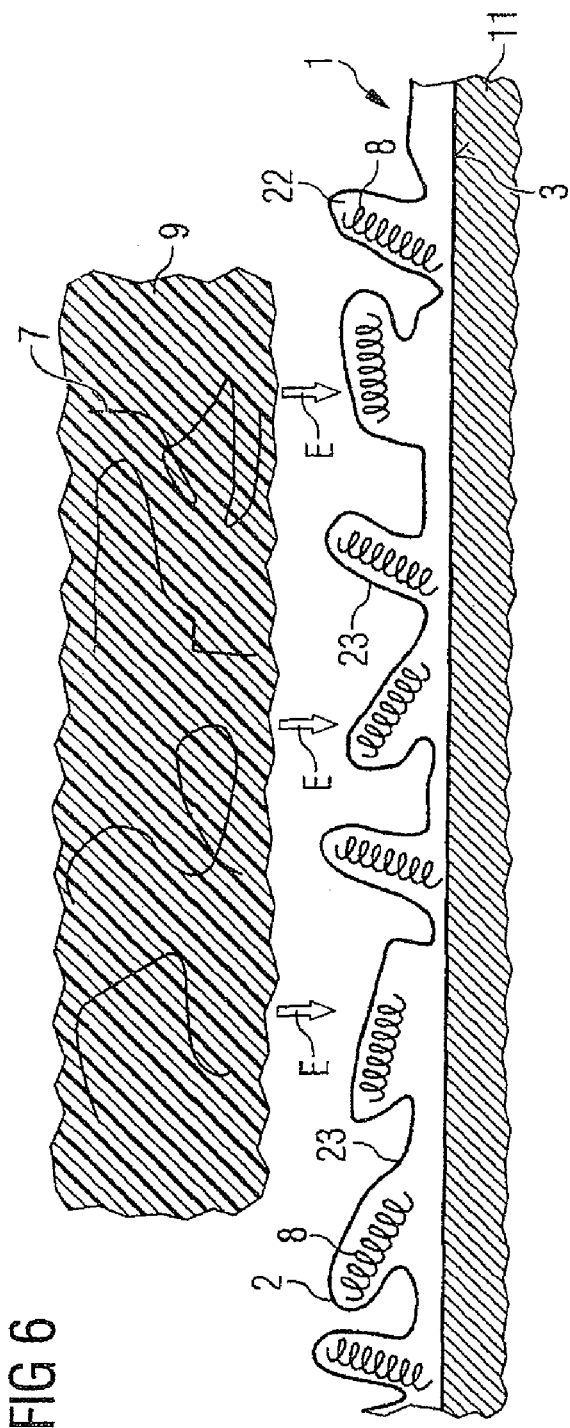
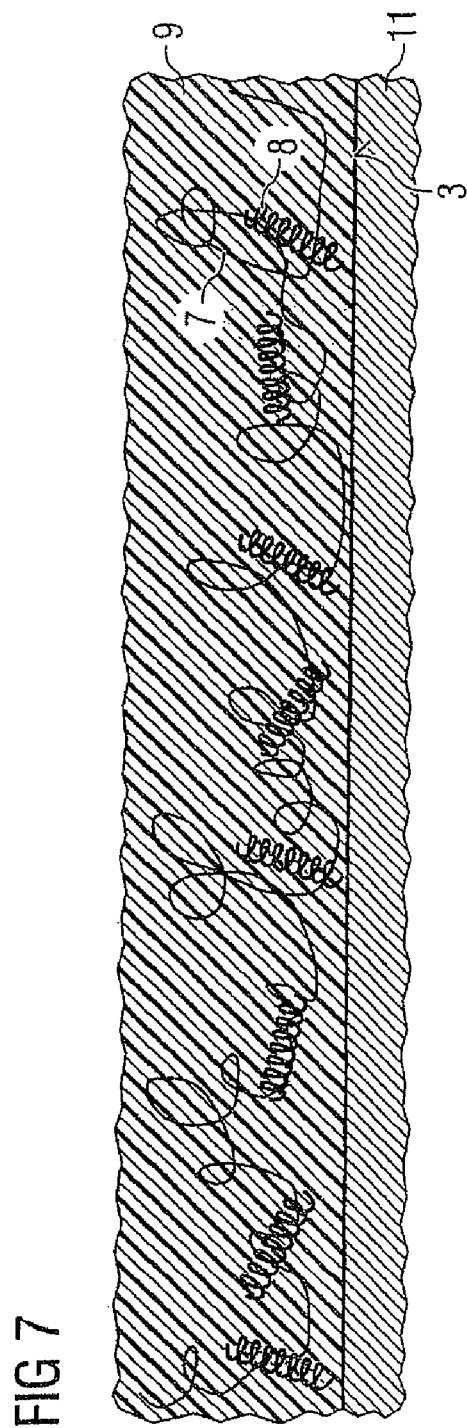

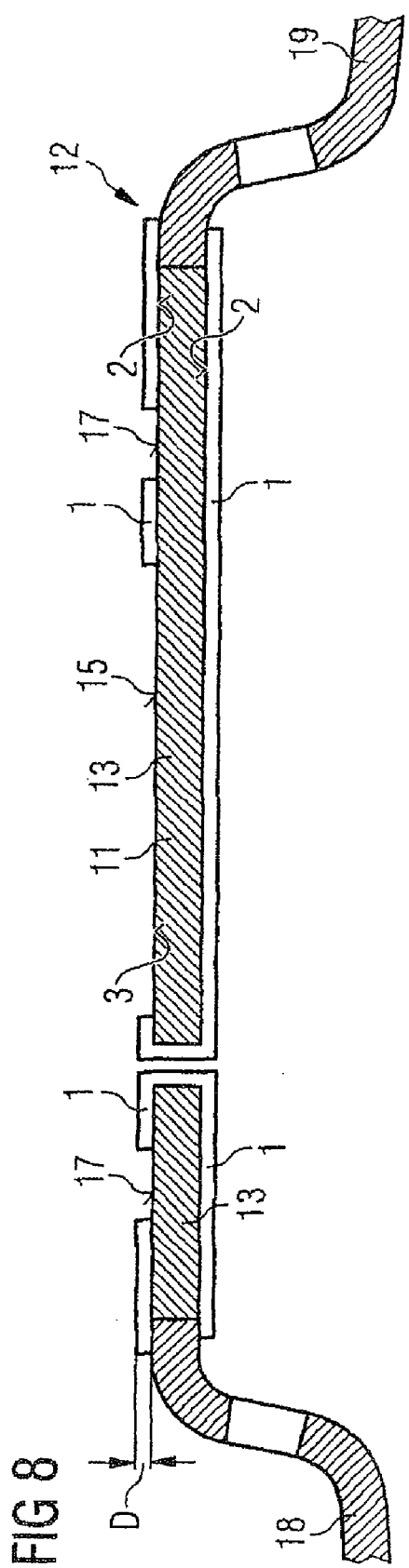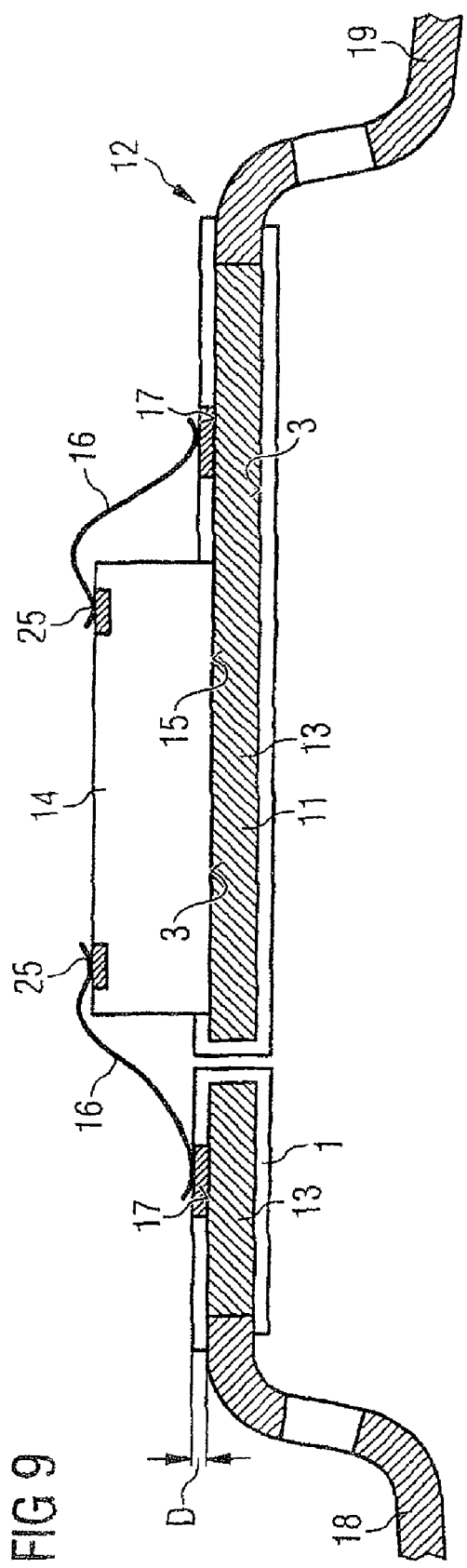

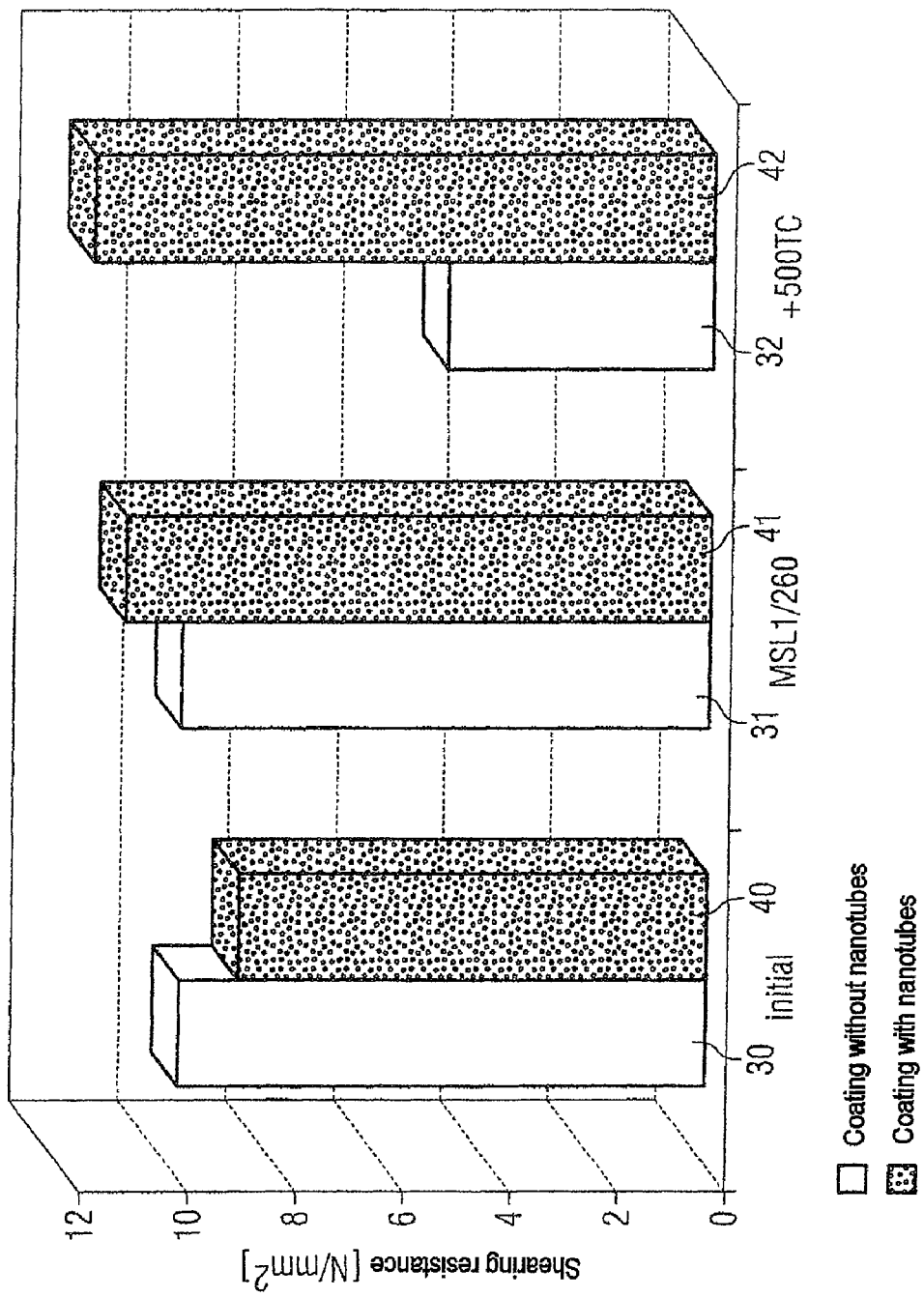

LAYER BETWEEN INTERFACES OF DIFFERENT COMPONENTS IN SEMICONDUCTOR DEVICES

CROSS REFERENCE TO RELATED APPLICATIONS

This application is a continuation of International Application No. PCT/DE2005/001722, filed on Sep. 28, 2005, entitled "Layer Between Interfaces of Different Components in Semiconductor Devices, and Method for Production Thereof," which claims priority under 35 U.S.C. §119 to Application No. DE 102004048201.2 filed on Sep. 30, 2004, entitled "Layer Between Interfaces of Different Components in Semiconductor Devices, and Method for Production Thereof," the entire contents of which are hereby incorporated by reference.

BACKGROUND

Some known methods use mechanical pre-working to roughen the surfaces of circuit carriers that form an interface with the plastic package molding compound or use physical-chemical methods, such as plasma etching, to achieve improved interlocking of the interfaces of different components. Still other methods such as electrolytic coating with adhesion-improving layers on the basis of inorganic and metallic compounds have been used. However, these known methods do not yield the desired results. Furthermore, the previous adhesion-improving measures, such as plasma etching, are extremely expensive and do not produce any significant improvement in the molding compound adhesion and remain confined to the preparation of electrically conductive surfaces.

However, modern circuit carriers include both metallic wiring structure surfaces and plastic surfaces, which are formed by the carrier material of the circuit carrier. The risk of delamination between a plastic package molding compound and the circuit carrier material also exists in these regions. Particularly hazardous is the penetration of moisture in such interfaces, with the result that, when a semiconductor device is soldered onto a superordinate circuit board, the so-called "popcorn" effect may occur, involving components of the semiconductor device, in particular parts of the plastic package, popping off from the surface of the circuit carrier.

SUMMARY

Described herein is an adhesion-promotion layer for improving the adhesion between interfaces of different components in semiconductor devices and to a method for production of the same. Such layers are intended to contribute to improving the previously inadequate adhesion of a plastic package molding compound to the relevant surfaces or interfaces in semiconductor devices, especially since such instances of inadequate adhesion lead to increased failure and to risks of faults occurring in semiconductor devices, which may cause failure of the devices, in particular in the context of device qualification.

For this purpose of improving adhesion between interfaces of different components in semiconductor devices, the interface of a first component includes surfaces of a circuit carrier and the interface of a second component includes contact surfaces of a plastic package molding compound. The adhesion-improving layer includes a mixture of polymeric chain molecules and carbon nanotubes.

The above and still further features and advantages of the described layer and method will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

FIGS. 2 to 10 show schematic representations of the production of a semiconductor device with a layer according to the first embodiment;

FIG. 2 shows a schematic cross section through a circuit carrier with a protective layer before immersion coating;

FIG. 3 shows a diagram of an immersion coating of the circuit carrier according to FIG. 2;

FIG. 4 shows a schematic perspective view of a single-walled carbon nanotube;

FIG. 5 shows a schematic cross section of a circuit carrier with a suspension coating comprising carbon nanotubes;

FIG. 6 shows a schematic cross section of the circuit carrier of FIG. 5 after evaporation of a solvent from the coating;

FIG. 7 shows a schematic cross section of a circuit carrier according to FIG. 6 with applied plastic molding compound;

FIG. 8 shows the schematic cross section of the circuit carrier according to FIG. 2 after application of the layer and after removal of the protective layer;

FIG. 9 shows a schematic cross section of the circuit carrier according to FIG. 8 after application of contact terminal areas and after fixing of a semiconductor chip and after connection of the contact surfaces of the semiconductor chip to the contact terminal areas of the circuit carrier;

FIG. 10 shows the schematic cross section of a semiconductor device after application of a plastic package molding compound to the circuit carrier; and FIG. 11 shows a comparison of the shearing resistance of interfaces with different adhesion-promoting layers.

DETAILED DESCRIPTION

Figure 1:
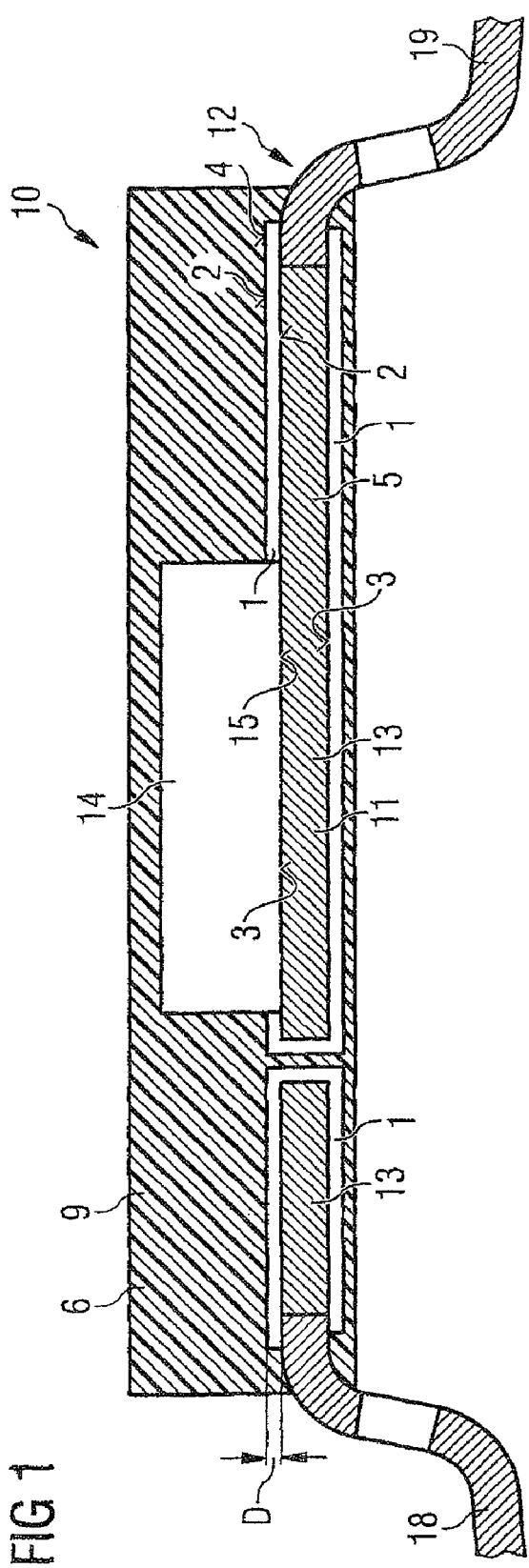
FIG. 1 shows a schematic cross section through a semiconductor device with a layer according to a first embodiment.

Described herein is an adhesion-promotion layer for improving the adhesion between interfaces of different components in semiconductor devices and to a method for production of the same. The layer can be used between interfaces of different components in semiconductor devices that decisively improve the adhesion between interfaces. Accordingly, the layer is arranged between interfaces of different components in semiconductor devices. One component comprises, as an interface, surfaces of a circuit carrier and another component comprises as an interface contact surfaces of a plastic package molding compound. In this case, the layer comprises a mixture of polymeric chain molecules and carbon nanotubes.

One advantage of this layer of a mixture of polymeric chain molecules and carbon nanotubes is that this layer can in principle be arranged on surfaces of a wide variety of materials and that the processing is very simple and causes low material costs. This layer further includes the following advantages: a clear improvement in the adhesion of the plastic package molding compound on all surfaces coated with this layer; a slowing of corrosion on all metallic surfaces to which the layer is applied, the layer contributing to the stabilization of the metallic surfaces; a targeted, selective coating by suitable choice of the method. This can be performed for example by targeted masking or by full-area coating with selective stripping with solvents, laser ablation or other methods of mechanical removal; and a targeted adjustability of the electrical and thermal conductivity of the layer via the proportion of carbon nanotubes by volume.

This adhesion-improving layer can be produced not only by epitaxial growth of carbon nanotubes but also by the addition or application of a composite layer, which primarily comprises a polymer and carbon nanotubes, preferably after a coating operation. Immersion, spraying, brushing etc. are conceivable here as the coating operation. An optional form of application is via an inkjet printer method. This allows an adhesion-promoting layer to be applied with pinpoint accuracy even after the application of a semiconductor chip. Screen printing is also suitable for applying the adhesion promoter layer.

In an embodiment of the layer, this aforementioned proportion of carbon nanotubes V is 1% by volume $\leq V \leq 10\%$ by volume (i.e., the proportion of carbon nanotubes is in the range of about 1% to 10% by volume of the layer), the rest of the volume being formed by polymeric chain molecules. This has the advantage that such a low proportion on the one hand does not significantly increase the costs of this layer and on the other hand does not cause electrical conductivity and/or short-circuits via the carbon nanotubes. Furthermore, this low proportion of carbon nanotubes has the advantage that the polymer chains can extend both inside and outside the nanotubes, and consequently there is a close interlinkage between carbon nanotubes and polymeric chain molecules in the layer. This interlinkage simultaneously achieves the effect of increased anchorage of the plastic package molding compound on a surface prepared with such a layer. Consequently, tearing-away or delamination of the mechanical connection between two interfaces is prevented by the layer containing carbon nanotubes.

In a further embodiment, the carbon nanotubes have a diameter d of the order of magnitude of nanometers, optionally such that $1.2 \text{ nm} \leq d \leq 300 \text{ nm}$ (i.e., a diameter in the range from about 1.2 nm to about 300 nm). One advantage of these nanotubes with such a small diameter is the possibility of realizing extremely small layer thicknesses. Consequently, the carbon nanotubes make possible layer thicknesses of $1.5 \text{ nm} \leq d \leq 300$ nm, optionally $10 \text{ nm} \leq d \leq 30$ nm, if the layer has multi-walled carbon nanotubes.

In the case of single-walled carbon nanotubes, it is even possible to achieve layer thicknesses of below 1.5 nm. Consequently, with single-walled carbon nanotubes, much thinner layers can be realized, especially since these single-walled carbon nanotubes have a diameter of $0.6 \text{ nm} \leq d \leq 1.8$ nm (i.e., in the range between about 0.6 nm and about 1.8 nm).

In addition, the carbon nanotubes have the advantage of a low density, which at 1.33 to 1.4 g/cm$^2$ comes close to the density of a plastic package molding compound. The tensile strength of carbon nanotubes at about 10$^{11}$ Pa is also better by several orders of magnitude than in the case of plastics. As a result, the risk of delamination between contact surfaces of the plastic molding compound and the layer that has the carbon nanotubes is reduced. In particular under high thermal loading on account of different coefficients of expansion of the materials involved, the high tensile strength of the carbon nanotubes in comparison with conventional constructions brings about a greater tensile load-bearing capacity and shearing resistance of the adhesion-promoting layers.

Furthermore, it is possible to use carbon nanotubes of a length of the order of magnitude of several 10 s of nanometers to several micrometers (i.e., a length in the range of about several 10 s of nanometers to about several micrometers). Since, in spite of their length of between 10 nm and several µm, the carbon nanotubes do not have any grain boundaries, their deformability and elasticity is significantly greater and breaking-open or the formation of microcracks at grain boundaries is virtually impossible. Consequently, the adhesion-promoting layer in which carbon nanotubes are arranged has flexurally resistant, deformable and elastic anchors, which can form anchorages both in the plastic package molding compound and on metallic surfaces, as well as on plastic or epoxy resin surfaces.

In a further embodiment, the layer is formed as more than one layer and comprises a base layer with at least one of the metals selected from the group including: nickel, iron, molybdenum, cobalt and alloys of the same. This base layer has the advantage that it comprises metals which serve as a catalyst for the formation of carbon nanotubes. Consequently, a further layer on this base layer may comprise carbon nanotubes which have formed from seeds of carbon nanotubes. This two-layered layer comprising a base layer and a layer with carbon nanotubes has the advantage that it can closely interlock with the interfaces of the plastic package molding compound.

In addition, it is possible to form a layer which has as the second layer on the base layer a mixture of carbon nanotubes and polymeric chain molecules before a plastic package molding compound is brought into interfacial contact with this layer. This second layer of a mixture of carbon nanotubes and polymeric chain molecules of an organic primer may have a close interlinkage of the two structures and consequently provide an adhesion-improving effect.

In a further embodiment, the layer comprises three layers, including a base layer, a layer with carbon nanotubes and a layer with polymeric chain molecules. In this case, the polymeric chain molecules may already be the chain molecules of a plastic package molding compound. This three-layered form has the advantage that the transition to a plastic package molding compound can be realized without the formation of thermal stresses.

The heat conduction in the case of such adhesion-improving intermediate layers is likewise a factor that can contribute decisively to the improvement of a semiconductor device. For carbon nanotubes it has been found that, at up to 6000 W/m° K., the thermal conductivity is virtually twice as high as that of diamond. In addition, the fracture strength in particular of the adhesion-promoting intermediate layer may be further improved by multi-walled carbon nanotubes.

As mentioned above, the diameter d of such multi-walled carbon nanotubes is $1.5 \text{ nm} \leq d \leq 300$ nm for the application as adhesion-improving particles in a layer on a circuit carrier. Optionally, carbon nanotubes with a diameter d of $10 \leq d \leq 30$ nm are provided. This has the advantage that a layer of carbon nanotubes that produces increased anchorage via a number of carbon nanotubes to counter tearing-away of the multi-layered connection along the two interfaces can be used on circuit carriers. For this purpose, in a further embodiment, the carbon nanotubes may be aligned in a columnar manner between the interfaces.

Semiconductor devices with components which have a layer with the aforementioned composition are described herein. Such semiconductor devices may additionally be characterized in that this layer is arranged on a circuit carrier which is partially provided with this layer. This partial coating concerns the fact that certain regions of the circuit carrier are intended for contact terminal areas known as "bonding pads", which enter into a material-bonding metallic connection and consequently have to be kept free of the layer containing carbon nanotubes.

Furthermore, there are semiconductor devices that have circuit carriers which have areas for the application of back sides of semiconductor chips. These areas of a circuit carrier then also remain free of the insulating adhesion-promoting layer, in particular if an ohmic contact is desired. Consequently, the layer is optionally used as an adhesion promoter in semiconductor devices between a circuit carrier and a plastic package molding compound. For this purpose, the layer is arranged on a wiring substrate as a circuit carrier, the wiring substrate comprising surfaces of a plastic carrier material and/or a ceramic carrier material and structured metallic surfaces of wiring lines. The layer as described herein for improving the adhesion can be readily and selectively applied to these different materials, leaving the aforementioned areas free.

In a further application, the layer is arranged on a leadframe as a circuit carrier, the leadframe comprising internal leads with metallic surfaces on which the layer is arranged. Such internal leads are to be intensively connected to the plastic package molding compound, in order that they cannot be torn out from the plastic package molding compound during further processing. It is also intended that microcracks, which can let in moisture and ultimately lead to failure of the semiconductor device, must not occur at the interfaces between the plastic package molding compound and the internal lead.

Furthermore, circuit carriers comprising ceramic substrates can be provided with the adhesion-promoting layer, with the advantage that they can be used in particular for high-frequency devices and integrated circuits for high frequencies in the giga and terahertz range.

Furthermore, the circuit carrier may comprise an insulating base plate of a plastic, preferably of a fiber-reinforced epoxy resin, on which a number of semiconductor chips are arranged and are connected with the aid of the carbon nanotube layer to a plastic package molding compound, and represent a blank. In this case, it is also an advantage if the adhesion-improving layer with carbon nanotubes is not only arranged on the insulating base plate and the interconnects, but also covers the semiconductor chips and even provides a coating over the connecting elements.

A method for producing a layer between interfaces of different components in semiconductor devices comprises the following method steps. First, a circuit carrier of a semiconductor device is produced with surfaces which carry a semiconductor chip and interfaces which are encapsulated with a plastic molding compound. Subsequently, a layer is selectively applied to the interfaces of the circuit carrier, the interfaces being coated at least with carbon nanotubes. This method has the advantage that the layer with carbon nanotubes is only applied to the locations of the circuit carrier that come into contact with a plastic package molding compound, so that on the one hand this involves very low material consumption and on the other hand the areas of the circuit carrier that have to receive the electrical connecting lines and/or semiconductor chips remain free.

Preferably, for the selective application of the layer to the interfaces of the circuit carrier, the surface regions of the circuit carrier are provided with a protective layer. This protective layer is applied to regions that are to be protected from the adhesion-improving layer, so that subsequently, the circuit carrier can be immersed in a suspension which comprises carbon nanotubes. In the case of this immersion method, everything that has already been installed on the circuit carrier and is not protected by the protective layer is coated with a corresponding adhesion layer of carbon nanotubes. The protective layer is removed after the application of the adhesion-promoting layer.

In a further method for producing layers, carbon nanotubes are used via the liquid phase, by applying a suspension of seeds for the formation of carbon nanotubes. This liquid phase is applied to previously and selectively applied layers of a coating of catalyst material, i.e., a layer which comprises one of the metals nickel, iron, molybdenum, cobalt or alloys of the same. For this purpose, the solution optionally comprises carbon fullerenes as seeds for the formation of carbon nanotubes, which are in the form of small graphite balls, and form single-walled hexagonally structured spherical graphite patterns.

Under the influence of the catalyst material, which has been applied as a base layer, these fullerenes generate carbon nanotubes as solid substances in a suspension. In the process, the seeds may be mixed with oligomers of a synthetic resin and, with thermal treatment of the solution, subsequently form interengaging carbon nanotubes and chain molecules of the synthetic resin, which are closely interlinked with one another.

In addition, such layers with carbon nanotubes may be formed via printing techniques for application to a circuit carrier with appropriate precursors of the carbon nanotubes, which are then transformed into the carbon nanotubes. In this case it is also possible, for example, for a suspension of a solution with carbon nanotube precursors to be mixed with appropriate catalyst metal particles in the solvent, which is then selectively applied as a suspension or solution to the surfaces of the circuit carrier via a printing technique.

The transformation of the precursors of the carbon nanotubes into a carbon nanotube network is finally achieved by low-temperature processes. After producing an adhesion-promoting layer with carbon nanotubes, the solvent and the catalyst elements contained in the solvent can be removed from the circuit carrier by a cleaning step.

A method for producing a semiconductor device with a layer between interfaces of different components, one component comprising as an interface surfaces of a circuit carrier and another component comprising as an interface contact surfaces of a plastic package molding compound, includes the following method steps. First, the adhesion-promoting layer is selectively applied by a method such as that described above to the circuit carrier including a number of semiconductor device positions. Subsequently, the semiconductor chips are fixed on the circuit carrier in the regions that do not have such an adhesion-promoting layer. Thereafter, electrical connections can be established between semiconductor chips and coating-free contact terminal areas of the circuit carrier in the semiconductor device positions. Finally, the semiconductor chips and the electrical connections are introduced into a plastic molding compound while the plastic package molding compound is at the same time applied to the coated interfaces of the circuit carrier.

The application of the plastic molding compound may be performed via an injection-molding technique, which is also referred to as "molding" or a "molding technique". This method has the advantage that the plastic package molding compound is applied to a circuit carrier which, by the application of an adhesion-promoting layer of carbon nanotubes, makes improved adhesion possible between the layer of plastic and the circuit carrier, so that delamination and microcracks in the interfaces are avoided. The application of the plastic package molding compound may be performed via a conventional injection-molding technique.

It is particularly advantageous to modify the method to the extent that the adhesion-promoting layer with carbon nanotubes is only applied after the circuit carrier, semiconductor chip and connecting elements have been connected, so that the surfaces of the semiconductor chip and of the connections are also coated with such an adhesion-promoting layer by the immersion method, spray method and/or inkjet printing method.

It is consequently possible either before or after establishing the electrical connections between the semiconductor chip and the circuit carrier to coat the circuit carrier including the semiconductor chip, with a solution of the organic substance of polymers and functional organic molecules or other carrier materials, which react and crosslink after the application of the polymer layer, it being possible for a percentage of from 0.1 to 5% by mass of carbon nanotubes to be mixed into this polymer layer, as desired. Apart from the immersion technique, the coating method may also comprise spraying, drip coating or screen printing.

After the curing of the coating with subsequent application of the plastic package molding compound, this layer leads to a distinct improvement in adhesion with the plastic package molding compound, two effects being used: first a chemical and physical effect through the interaction of the organic layer with the plastic package molding compound and second a mechanical anchorage of the epoxy oligomers flowing into the cavities of the carbon nanotubes. Furthermore, the adhesion-promoting surface area of the polymeric layer is increased by the introduction of carbon nanotubes.

As a result, a greater bonding strength is realized between the layer with carbon nanotubes and the plastic package molding compound than is possible by previous organic adhesion-promoting coatings in which nanotubes are not incorporated.

Moreover, targeted adjustment of the thermal conductivity can be achieved via the proportion of carbon nanotubes incorporated or, and if desired, electrical conductivity can also be produced via an electrochemical deposition of metallic structures on the adhesion-promoting layer. However, electrical conductivity is only achieved when the percolation threshold of the nanotubes is exceeded.

In summary, the following advantages of the nanotubes are employed: first an increase in the mechanical strength of the coating, second reduction of the moisture absorption, third reduction of the coefficient of thermal expansion, and consequently reduction of thermal stresses, and fourth the possibility of achieving ultra-thin coatings with nanotubes that are smaller than about 5 nm, for better and more homogeneous integration of the polymer matrix of the plastic package molding compound.

Exemplary embodiments of the adhesion-promoting layer and method of producing the same are described in connection with the figures.

FIG. 1 shows a schematic cross section through a semiconductor device 10 with a layer 1 according to a first embodiment. In this first embodiment, the semiconductor device 10 is constructed on a circuit carrier 11, which is punched out from a leadframe 12. The leadframe 12 has external leads 18 as external contacts 19 and internal leads 13 for the connection of a semiconductor chip 14. The internal leads 13 are held by a plastic package molding compound 9, which has a contact surface 4 with respect to an interface 2 of the adhesion-improving layer 1. The internal leads 13 have surfaces 3, which are partially coated with the adhesion-improving layer 1.

The semiconductor chip 14 is carried by one of the internal leads 13 on a coating-free surface region 15 and is likewise embedded in the plastic package molding compound 9. In this embodiment, the surfaces of the semiconductor chip 14 do not have an adhesion-improving layer. However, the remaining surfaces 3 of the internal leads 13, as the first component 5, are completely coated with the adhesion-improving layer 1. For this purpose, the layer 1 comprises carbon nanotubes, which on the one hand improve the interlocking with the chain molecules of the second component 6, namely the plastic package molding compound 9, and make mechanical anchorage of the plastic package molding compound 9 on the circuit carrier 11 possible.

FIGS. 2 to 10 show schematic representations of the production of a semiconductor device with a layer according to the first embodiment of the invention. Components with the same functions as in FIG. 1 are identified in FIGS. 2 to 10 by the same designations and are not separately explained.

FIG. 2 shows a schematic cross section through a circuit carrier 11 with a protective layer 24 before immersion coating. This circuit carrier 11 is once again part of a leadframe 12 and has internal leads 13, the surfaces 3 of which are partially free of protective layers 24, in order that the adhesion-improving layer according to the invention is deposited on them. All the surfaces 3 of the internal leads 13 that are kept free of the protective layer 24 can be coated with a suspension by the immersion method shown in FIG. 3.

FIG. 3 shows a basic diagram of an immersion coating of the circuit carrier 11 of FIG. 2. For this purpose, a container 20, which is open vertically at the top and filled with a suspension 21 of carbon nanotubes 8 and polymeric chain molecules 7, is provided. When the leadframe 12, provided with a selectively applied protective layer, is immersed in the direction of the arrow A into the container 20, there forms on the upper side of the protective layer and on the unprotected surfaces of the leadframe 12 a layer a few nanometers thick to several micrometers thick of carbon nanotubes 8 and polymeric chain molecules 7, which interlink in one another and form an initial coating comprising a suspension 21 of solvents, nanotubes 8 and polymeric chain molecules 7 when the leadframe 12 is pulled out.

FIG. 4 shows a three-dimensional schematic representation of a single-walled carbon nanotube 8 with hexagonally arranged carbon atoms C. This hexagonal arrangement of six carbon atoms C corresponds to the known benzene ring, which represents a preferred structure of the carbon atom C, double electron bonds rotating in each ring for the purpose of stabilizing the ring, which promotes the electrical conductivity of such a carbon nanotube 8. The length l may extend from a few 10 s of nanometers to several 10 s of micrometers, (e.g., in the range from at least about 10 nanometers (nm) to several micrometers, (μm)). The diameter d for the single-walled carbon nanotube 8 represented in FIG. 4 lies in the range from 0.6 to 1.8 nm. In the case of multi-walled carbon nanotubes 8, coaxially arranged cylindrical walls are nested one inside the other, so that multi-layered carbon nanotubes 8 may reach a diameter of from 1.5 nm to 300 nm. Optionally, in the embodiment, the carbon nanotubes 8 have a diameter range of $10\text{ nm} \leq d \leq 30\text{ nm}$.

Figure 5:
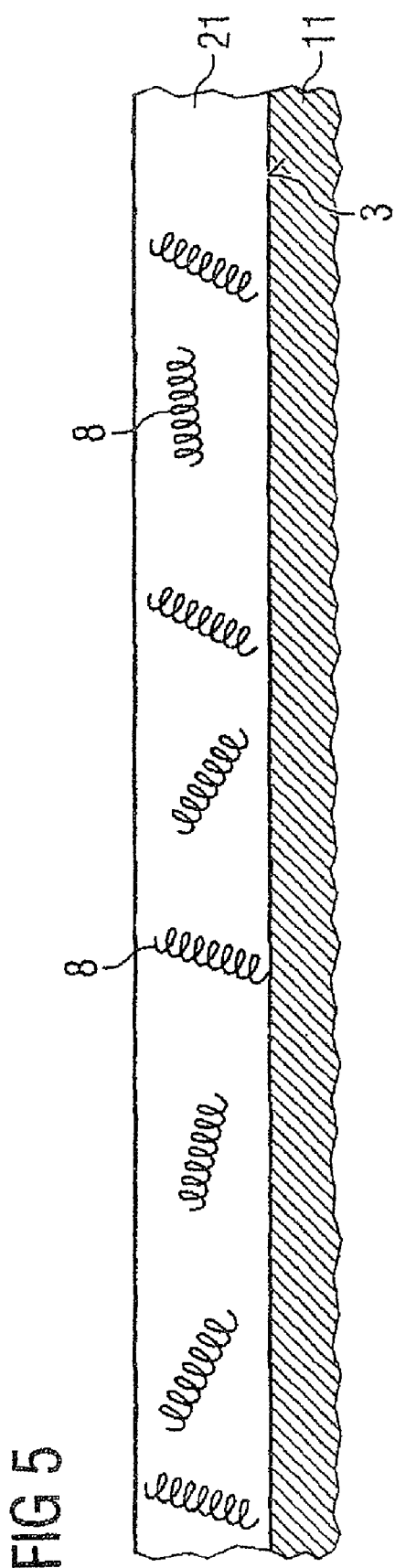

FIG. 5 shows a schematic cross section of a circuit carrier 11 with a suspension coating 21, which comprises carbon nanotubes 8. This suspension coating 21, which wets the surfaces 3 of the circuit carrier 11 that are not provided with a protective layer, has along with a binder a volatile solvent, which evaporates when the circuit carrier 11 heats up after the immersion coating.

FIG. 6 shows a schematic cross section of a circuit carrier 11 after evaporation of the solvent from the suspension coating 21, as it is shown in FIG. 5. The remaining coating 22 comprising a binder and the carbon nanotubes 8 has a relatively irregular fissured surface 23 on account of the structure of the carbon nanotubes 8, as they are shown in FIG. 4. A plastic package molding compound 9, which comprises polymeric chain molecules 7, is applied in a viscous state to the surface 23 in the direction of the arrow E. In the process, a close interlinking of the polymeric chain molecules 7 with the carbon nanotubes 8 of the coating 22 may take place.

FIG. 7 shows a schematic cross section of a circuit carrier 11 according to FIG. 6 with applied plastic package molding compound 9. In this state, the polymeric chain molecules 7 of the plastic package molding compound 9 are already closely interlinked with the carbon nanotubes 8 of the coating 22, so that an intensive anchorage of the plastic package molding compound 9 on the surface 3 of the circuit carrier 11 occurs.

FIG. 8 shows the schematic cross section of the circuit carrier 11 according to FIG. 2 after application of a layer 1 according to the invention and after removal of the protective layer 24, as it is shown in FIG. 2. In this case, the external leads 18 are kept free of an adhesion-improving layer 1 and, on the internal leads 13, the protected contact terminal areas 17 likewise remain free of an adhesion-improving layer 1. The surface regions 15 of an internal lead 13 also remain free of an adhesion-improving layer 1 and can receive a semiconductor chip.

FIG. 9 shows the schematic cross section of the circuit carrier 11 according to FIG. 8 after application of a metallic coating to the contact terminal areas 17 and after fixing of a semiconductor chip 14 on the internal lead 13 and after establishment of electrical connections 16 between contact areas 25 of the semiconductor chip 14 and the metallized contact terminal areas 17. In this embodiment, there is no need for immersion coating of all the components that are to be embedded in the plastic molding compound and, in a next step, the plastic package molding compound is applied by an injection-molding technique. On the other hand, it is of advantage only to perform an immersion coating of all the components when the components are installed, so that the semiconductor chip and the electrical connections between the semiconductor chip and the circuit carrier can also be reliably anchored in the plastic package molding compound.

Figure 10:
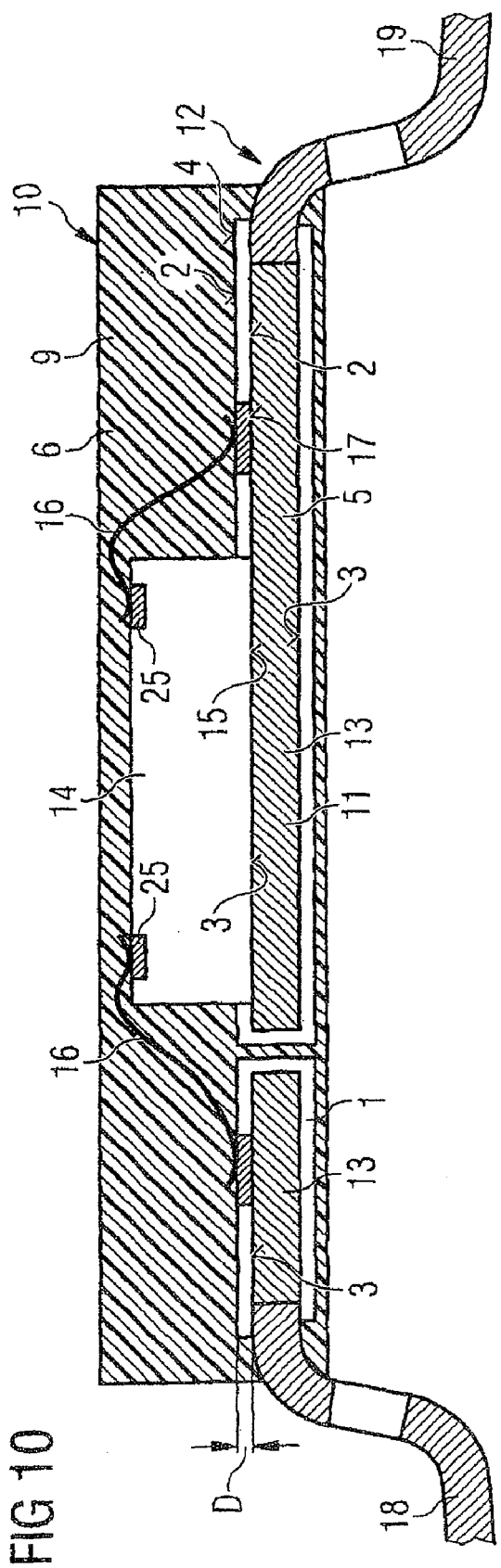

FIG. 10 shows a schematic cross section through a semiconductor device 10 after application of a plastic package molding compound 9 to the circuit carrier 11. Internal leads 13 are completely embedded in the plastic package molding compound 9, to the extent that they do not carry a semiconductor chip 14, and are thereby at the same time mechanically connected to the plastic package molding compound 9. In the process, the mechanisms described with FIGS. 5, 6 and 7 occur at the interfaces 2 between the plastic package molding compound 9 and the circuit carrier 11.

FIG. 11 shows a graphic representation of a comparison of the shearing resistance of interfaces 2 with different adhesion-promoting layers. For this purpose, the shearing resistance in N/mm$^2$ is plotted on the y-axis of the graph and adhesion-improving coatings without carbon nanotubes are represented on the x-axis by the columns 30, 31 and 32. As a comparison, coatings with carbon nanotubes are shown by the columns 40, 41 and 42.

While in the case of the columns 30, 31 and 32 without a nanotube coating, from an initial shearing resistance of somewhat over 8 N/mm$^2$, there is a decrease of almost 20% as the mechanical loading (column 31) and thermal loading (32) increase, the coating provided with carbon nanotubes corresponding to the columns 40, 41 and 42 increases in its shearing resistance, from initially over 8 N/mm$^2$ (column 40) to over 10 N/mm$^2$, under mechanical loading (column 41) and thermal loading (42). Consequently, the layer according to the invention, with a proportion of 1% by volume $\leq \Delta V \leq 10\%$ by volume of carbon nanotubes (i.e., in the range from about 1% to about 10% by volume) and the remainder comprising polymeric chain molecules, shows an improvement over conventional adhesion-promoting measures.

The increase in the shearing resistance when thermal cycles are applied additionally shows the improvement in adhesion of this novel material for the layer in comparison with conventional adhesion-improving layers. This increase under changing thermal loads, as shown by column 42 in FIG. 11, is surprising and unexpected to one of ordinary skill in the art. While not being bound by any particular theory, this increase under changing thermal loads is believed to be due at least in part to the interlinking between polymeric chain molecules and carbon nanotubes increasing with thermal loading and the adhesion-promoting effect shifting from the chain molecules to the carbon nanotubes in the layer according to the invention.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor device comprising:
   a first component comprising a circuit carrier and including interfaces defining surfaces of the first component;
   a second component comprising a plastic molding compound and including interfaces defining contact surfaces of the second component; and
   a layer comprising an adhesion promoter disposed between the interfaces of the first and second components, the adhesion promoter comprising a mixture of a polymer and carbon nanotubes, wherein the carbon nanotubes of the adhesion promoter are interlinked with polymer chain molecules of the oligomer resin, the amount of carbon nanotubes in the layer being in the range from about 1% by volume of the layer to about 10% by volume of the layer, and the remaining volume of the layer comprising polymeric chain molecules such that a shearing resistance of the layer is greater than 8 newtons/mm$^2$.

2. The semiconductor device of claim 1, wherein each of the carbon nanotubes has a diameter that is from about 1.2 nanometers to about 300 nanometers.

3. The semiconductor device of claim 1, wherein the carbon nanotubes have lengths extending from about 10 nanometers to several micrometers.

4. The semiconductor device of claim 1, wherein the layer comprises a base layer including at least one metal selected from the group consisting of nickel, iron, molybdenum, cobalt and alloys thereof.

5. The semiconductor device of claim 4, wherein carbon nanotubes are disposed on the base layer.

6. The semiconductor device of claim 5, wherein the layer further comprises a layer with a mixture including carbon nanotubes and polymeric chain molecules disposed on the base layer.

7. The semiconductor device of claim 6, wherein the polymeric chain molecules are chain molecules of a plastic package molding compound.

8. The semiconductor device of claim 5, wherein the layer further comprises a layer with carbon nanotubes and a layer with polymeric chain molecules disposed on the base layer.

9. The semiconductor device of claim 8, wherein the polymeric chain molecules are chain molecules of a plastic package molding compound.

10. The semiconductor device of claim 4, wherein the layer further comprises a layer with a mixture comprising carbon nanotubes and polymeric chain molecules disposed on the base layer.

11. The semiconductor device of claim 10, wherein the polymeric chain molecules are chain molecules of a plastic package molding compound.

12. The semiconductor device of claim 4, wherein the layer further comprises a layer with carbon nanotubes and a layer with polymeric chain molecules disposed on the base layer.

13. The semiconductor device of claim 12, wherein the polymeric chain molecules are chain molecules of a plastic package molding compound.

14. The semiconductor device of claim 1, wherein the carbon nanotubes of the layer are arranged within the layer as columnar structures that are aligned virtually orthogonal to the interfaces of the first and second components.

15. The semiconductor device of claim 1, wherein the circuit carrier of the first component is partially provided with the layer.

16. The semiconductor device of claim 1, wherein the layer is arranged on a wiring substrate of the circuit carrier, and the wiring substrate includes surfaces comprising at least one of a plastic carrier material, a ceramic carrier material and structured metallic surfaces of wiring lines.

17. The semiconductor device of claim 1, wherein the circuit carrier comprises a leadframe including internal leads with metallic surfaces and the layer is arranged on the internal leads.

* * * * *